(12) United States Patent
Ueki

(10) Patent No.: US 11,444,078 B2
(45) Date of Patent: Sep. 13, 2022

(54) ESD PROTECTION ELEMENT

(71) Applicant: Murata Manufacturing Co., Ltd., Nagaokakyo (JP)

(72) Inventor: Noriyuki Ueki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 130 days.

(21) Appl. No.: 16/440,051

(22) Filed: Jun. 13, 2019

(65) Prior Publication Data

US 2019/0319025 A1 Oct. 17, 2019

Related U.S. Application Data

(63) Continuation of application No. PCT/JP2018/045431, filed on Dec. 11, 2018.

(30) Foreign Application Priority Data

Apr. 16, 2018 (JP) .............................. JP2018-078062

(51) Int. Cl.
*H01L 27/02* (2006.01)
*H05F 3/04* (2006.01)
(Continued)

(52) U.S. Cl.
CPC ..... *H01L 27/0288* (2013.01); *H01F 27/2804* (2013.01); *H01F 27/29* (2013.01);
(Continued)

(58) Field of Classification Search
CPC . H01L 29/866; H01L 23/5227; H01L 23/645; H01L 23/485; H01L 23/49838;
(Continued)

(56) References Cited

U.S. PATENT DOCUMENTS 7,002,434 B2 * 2/2006 Lin .......................... H03H 7/09
333/167
7,486,168 B2 * 2/2009 Kim .................... H01F 17/0013
336/200
(Continued)

FOREIGN PATENT DOCUMENTS

JP H07272136 A 10/1995
JP 2005101097 A 4/2005
(Continued)

OTHER PUBLICATIONS

International Search Report issued for PCT/JP2018/045431, dated Feb. 19, 2019 (Japanese language).

*Primary Examiner* — Jesse Y Miyoshi
(74) *Attorney, Agent, or Firm* — ArentFox Schiff LLP

(57) ABSTRACT

An ESD protection element includes a semiconductor substrate, a wiring layer, and an inductor conductor. The semiconductor substrate includes a Zener diode. The inductor conductor is provided on the wiring layer and has a two-dimensional spiral shape. The inductor conductor includes a first inductor conductor and a second inductor conductor that are continuously provided from an outer peripheral end toward an inner peripheral end, and a connection conductor portion in a vicinity of a portion at which the first inductor conductor and the second inductor conductor are connected to each other. The second inductor conductor has a width smaller than a width of the first inductor conductor.

23 Claims, 12 Drawing Sheets

(51) Int. Cl.
    *H01F 27/29*   (2006.01)
    *H01L 23/522*  (2006.01)
    *H01F 27/28*   (2006.01)
    *H01F 27/40*   (2006.01)
    *H01L 23/64*   (2006.01)
    *H01L 29/866*  (2006.01)

(52) U.S. Cl.
    CPC ....... *H01F 27/402* (2013.01); *H01L 23/5227* (2013.01); *H01L 23/645* (2013.01); *H01L 27/0255* (2013.01); *H01L 29/866* (2013.01); *H05F 3/04* (2013.01); *H01L 2924/1206* (2013.01); *H01L 2924/12035* (2013.01)

(58) Field of Classification Search
    CPC ..... H01L 23/49844; H01L 2924/12035; H01L 2924/1206; H01L 2924/19042; H01L 2223/6672; H01L 23/482; H01L 21/4853
    See application file for complete search history.

(56) References Cited

U.S. PATENT DOCUMENTS

| | | | | |
|---|---|---|---|---|
| 8,791,783 | B2* | 7/2014 | Miyazaki | H05K 1/185 336/192 |
| 2002/0020894 | A1* | 2/2002 | Nishijima | H01L 23/642 257/531 |
| 2005/0206470 | A1* | 9/2005 | Lin | H05K 1/165 333/32 |
| 2008/0157913 | A1* | 7/2008 | Kim | H01F 17/0013 336/200 |
| 2009/0273429 | A1 | 11/2009 | Nakamura | |
| 2011/0248811 | A1 | 10/2011 | Kireev | |
| 2011/0291231 | A1* | 12/2011 | Jiang | H01L 28/10 257/531 |
| 2013/0200977 | A1* | 8/2013 | Miyazaki | H05K 1/185 336/192 |
| 2015/0035625 | A1 | 2/2015 | Ohtomo et al. | |
| 2017/0236790 | A1* | 8/2017 | Chinnusamy | H01L 21/4853 438/126 |
| 2017/0373492 | A1 | 12/2017 | Ueki | |
| 2018/0261592 | A1* | 9/2018 | Soejima | H01L 23/645 |

FOREIGN PATENT DOCUMENTS

| | | |
|---|---|---|
| JP | 2009272360 A | 11/2009 |
| JP | 2013522955 A | 6/2013 |
| WO | 2012036207 A1 | 3/2012 |
| WO | 2017159282 A1 | 9/2017 |
| WO | 2018008422 A1 | 1/2018 |

* cited by examiner

ESD PROTECTION ELEMENT

CROSS REFERENCE TO RELATED APPLICATIONS

The present application is a continuation of PCT/JP2018/045431 filed Dec. 11, 2018, which claims priority to Japanese Patent Application No. 2018-078062, filed Apr. 16, 2018, the entire contents of each of which are incorporated herein by reference.

FIELD OF THE INVENTION

The present invention relates to an ESD protection element including a Zener diode and an inductor.

BACKGROUND

Conventionally, for the purpose of protecting an electronic component from surge such as electrostatic discharge, an ESD protection element or an ESD protection circuit has been put into practical use.

For example, International publication No. 2018/008422 discloses an inductor with an ESD protection function that uses a Zener diode and an inductor. The inductor with an ESD protection function as disclosed therein includes a first terminal, a second terminal, and a third terminal.

Moreover, the inductor is connected between the first terminal and the second terminal. The Zener diode is connected between a connection line to connect the first terminal and the second terminal, and the third terminal. The first terminal and the second terminal are used as an input and output terminal of a high-frequency signal, and the third terminal is connected to a ground potential, so that a low pass filter function and the ESD protection function are achieved.

Structurally, the Zener diode is provided at a semiconductor substrate and the inductor is provided on a wiring layer of a surface of the semiconductor substrate.

However, when the number of windings of the inductor connected between the first terminal and the second terminal becomes larger than one, depending on a way of connecting to the third terminal, the reflection characteristics (S11 characteristics) viewed from the first terminal differ from the reflection characteristics (S22 characteristics) viewed from the second terminal, and thus, transmission characteristics may be degraded.

SUMMARY OF THE INVENTION

In view of the foregoing, exemplary embodiments of the present invention provide an ESD protection element in which, in a configuration including an inductor and a Zener diode, reflection characteristics viewed from a first terminal are substantially the same as reflection characteristics viewed from a second terminal.

In one aspect, an ESD protection element of according to an exemplary embodiment of the present invention includes a substrate, a wiring layer, an inductor conductor, a first external connection terminal, a second external connection terminal, and a third external connection terminal. The substrate includes a semiconductor region including a surge absorbing element. The wiring layer is provided on the substrate. The inductor conductor is provided on the wiring layer and has a spiral shape including an outer peripheral end and an inner peripheral end. The first external connection terminal, the second external connection terminal, and the third external connection terminal are provided on the wiring layer. The inductor conductor includes a first inductor conductor disposed on an outer peripheral side including the outer peripheral end, a second inductor conductor disposed on an inner peripheral side including the inner peripheral end, and a connection conductor portion that connects the first inductor conductor and the second inductor conductor. Moreover, the outer peripheral end of the inductor conductor is connected to the first external connection terminal. The inner peripheral end of the inductor conductor is connected to the second external connection terminal. The connection conductor portion of the inductor conductor is connected to the third external connection terminal through the surge absorbing element. The second inductor conductor has a width smaller than a width of the first inductor conductor.

According to this exemplary aspect, inductance by a second inductor conductor of which the central opening is smaller than the central opening of the first inductor conductor can be made larger than inductance in a case in which the width of the first inductor conductor is equal to the width of the second inductor conductor. As a result, the first inductance of the first inductor conductor becomes substantially equal to the second inductance of the second inductor conductor.

In addition, the ESD protection element according to an exemplary embodiment of the present invention is preferably configured as follows. The substrate includes a terminal provided surface on which a first terminal conductor and a second terminal conductor are provided. The first terminal conductor is connected to the first end of the surge absorbing element, and the second terminal conductor is connected to the second end of the surge absorbing element.

In this configuration, connection between the surge absorbing element and the inductor conductor and connection between the surge absorbing element and the third external connection terminal are able to be ensured.

In addition, the ESD protection element according to an exemplary embodiment of the present invention is preferably configured as follows. The ESD protection element includes a first interlayer connection conductor that connects the outer peripheral end of the inductor conductor and the first external connection terminal, a second interlayer connection conductor that connects the inner peripheral end of the inductor conductor and the second external connection terminal, a third interlayer connection conductor that connects the connection conductor portion and the first terminal conductor, and a fourth interlayer connection conductor that connects the second terminal conductor and the third external connection terminal.

In this configuration, the surge absorbing element, the inductor conductor, and the first external connection terminal, the second external connection terminal, and the third external connection terminal each of which is disposed on a different layer are reliably connected to one another.

In the ESD protection element according to an exemplary embodiment of the present invention, the surge absorbing element can preferably include a Zener diode.

With this configuration, the surge absorbing element can be reliably obtained with a simple configuration.

In the ESD protection element according to an exemplary embodiment of the present invention, the connection conductor portion can preferably have a width larger than the width of the first inductor conductor.

In this configuration, a cross-sectional area of the third interlayer connection conductor can increased. Accordingly, transmission loss is reduced.

In the ESD protection element according to an exemplary embodiment of the present invention, the spiral shape can include a corner portion. In such a case, the connection conductor portion can preferably be disposed at the corner portion.

In this configuration, even when a pad portion for the connection conductor portion is not provided in an intermediate position of a spiral, a connection conductor portion with a large cross-sectional area is provided. In addition, the spiral shape is not deformed and degradation of the characteristics is significantly reduced or prevented.

In the ESD protection element according to an exemplary embodiment of the present invention, the spiral shape can include a bent portion or a curved portion. The connection conductor portion can be disposed at the bent portion or the curved portion.

In this configuration, it is not necessary to provide a pad portion for the connection conductor portion in an intermediate position of a straight portion of the spiral, and it is easy to provide a connection conductor portion with a large cross-sectional area. In addition, the spiral shape is not deformed and degradation of the characteristics is significantly reduced or prevented.

In the ESD protection element according to an exemplary embodiment of the present invention, a plurality of insulating layers can preferably be disposed between the inductor conductor and the substrate.

In this configuration, a distance between the substrate including the surge absorbing element TVS and the inductor conductor is able to be increased. As a result, an adverse effect of the substrate against magnetic flux generated in the inductor conductor are significantly reduced or prevented.

According to various exemplary embodiments of the present invention, in a configuration including an inductor and a Zener diode, reflection characteristics viewed from a first terminal are substantially the same as reflection characteristics viewed from a second terminal.

The above and other elements, features, steps, characteristics and advantages of the exemplary embodiments of the present invention will become more apparent from the following detailed description of the exemplary embodiments with reference to the attached drawings.

DETAILED DESCRIPTION

Figure 1A:
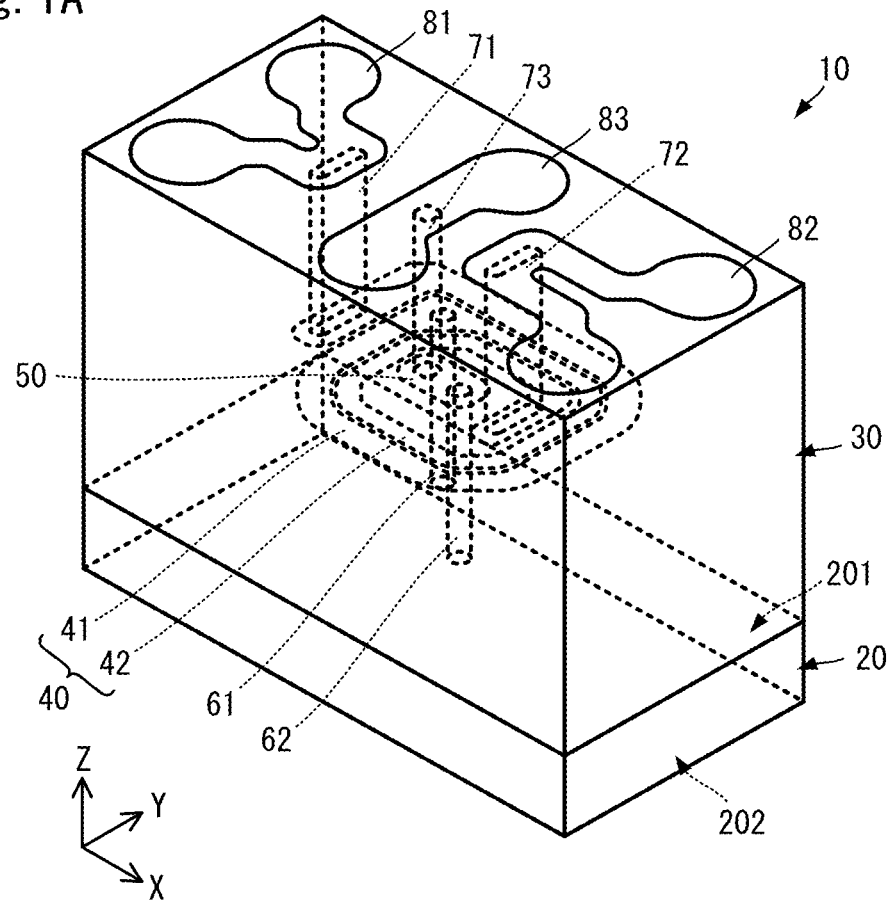
FIG. 1A is a perspective view of an ESD protection element 10 according to a first exemplary embodiment.

Hereinafter, a plurality of exemplary embodiments of the present invention will be described with reference to the drawings and several specific examples. In the drawings, components and elements assigned with the same reference numerals or symbols will represent identical components and elements. While exemplary embodiments of the present invention are divided and described for the sake of convenience in consideration of ease of description or understanding of main points, constituent elements described in different exemplary embodiments are able to be partially replaced and combined with each other. In second and subsequent exemplary embodiments, a description of matters common to the first exemplary embodiment will be omitted and only different points are described. In particular, the same functions and effects by the same configuration will not be described one by one for each exemplary embodiment.

Figure 1B:
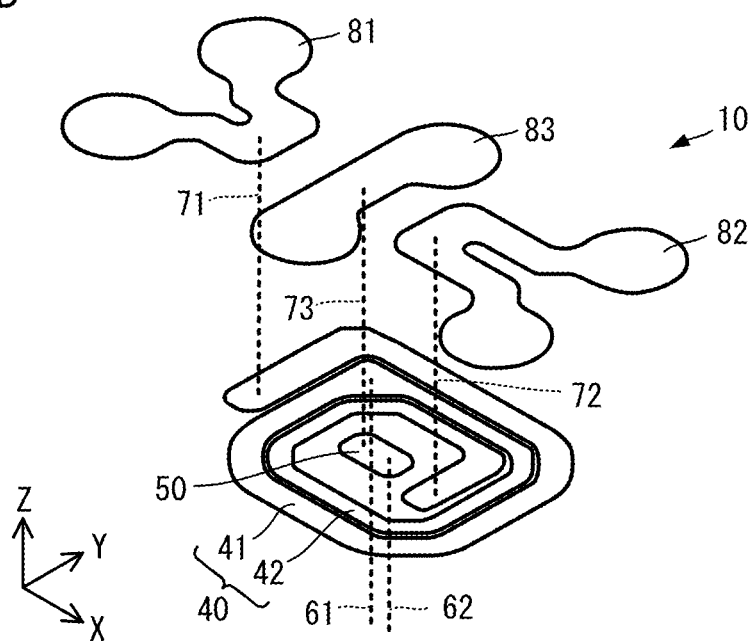
FIG. 1B is a view showing a schematic structure of a conductor pattern of the ESD protection element.
Figure 2:
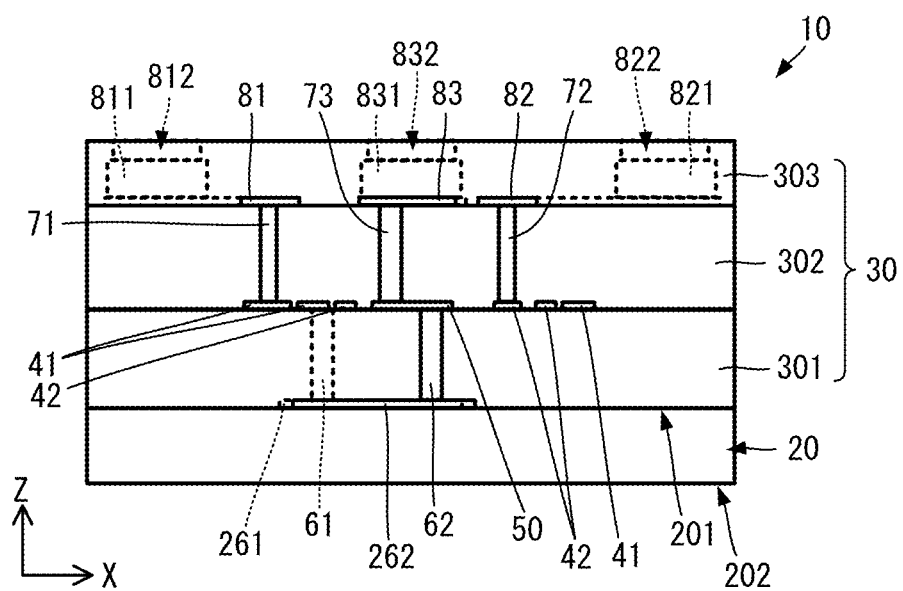
FIG. 2 is a cross-sectional side view of the ESD protection element 10 according to the first exemplary embodiment.
Figure 3A:
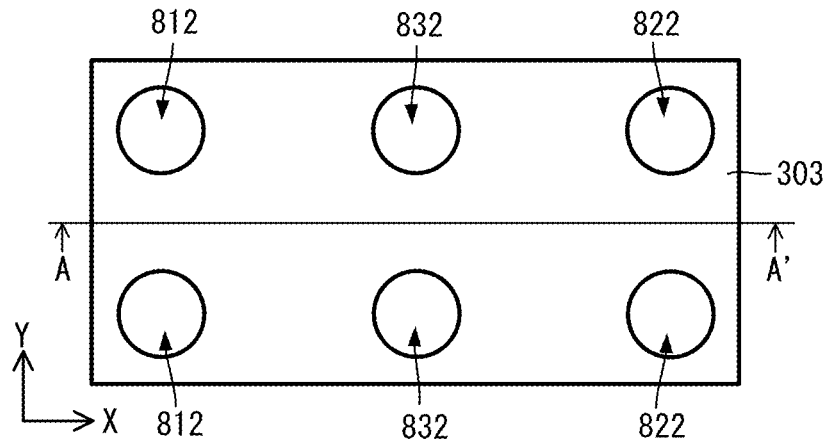
FIG. 3A, FIG. 3B, and FIG. 3C are views each showing a portion of an exploded plan view of the ESD protection element 10 according to the first exemplary embodiment.
Figure 3B:
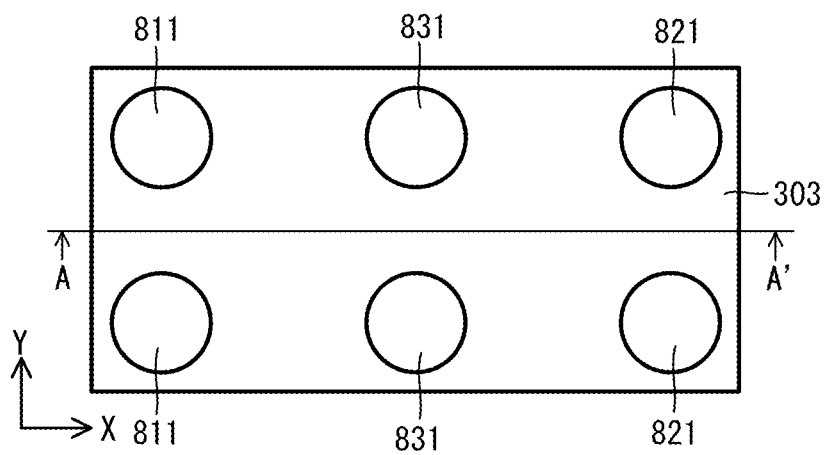
Figure 3C:
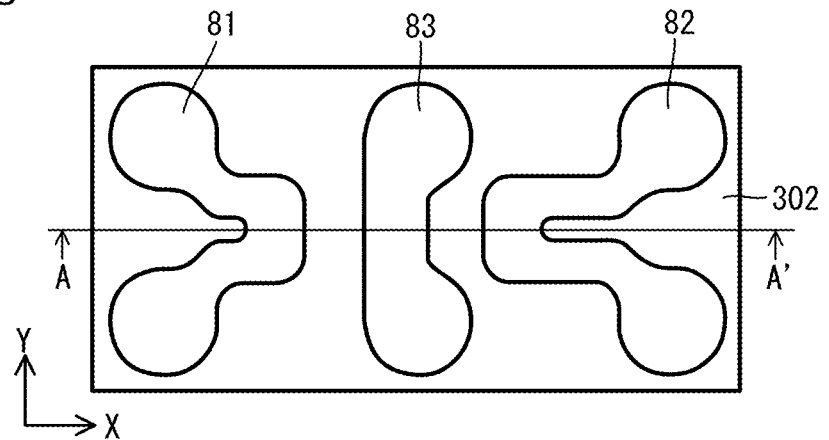
Figure 4A:
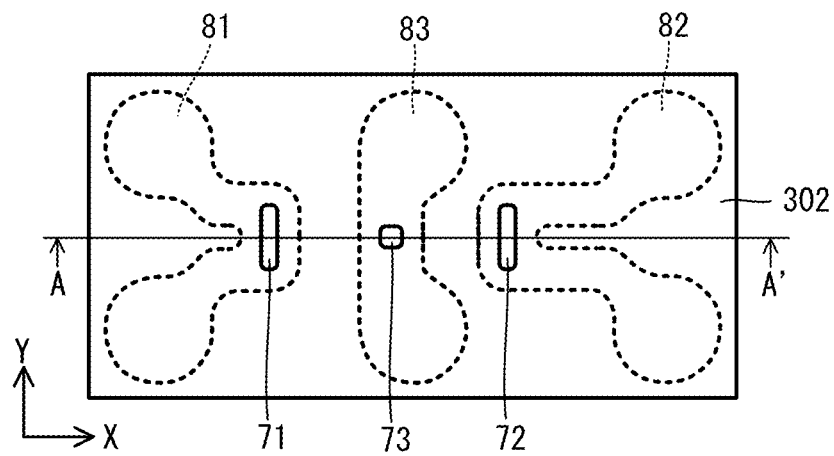
FIG. 4A, FIG. 4B, and FIG. 4C are views each showing a portion of the exploded plan view of the ESD protection element 10 according to the first exemplary embodiment.
Figure 4B:
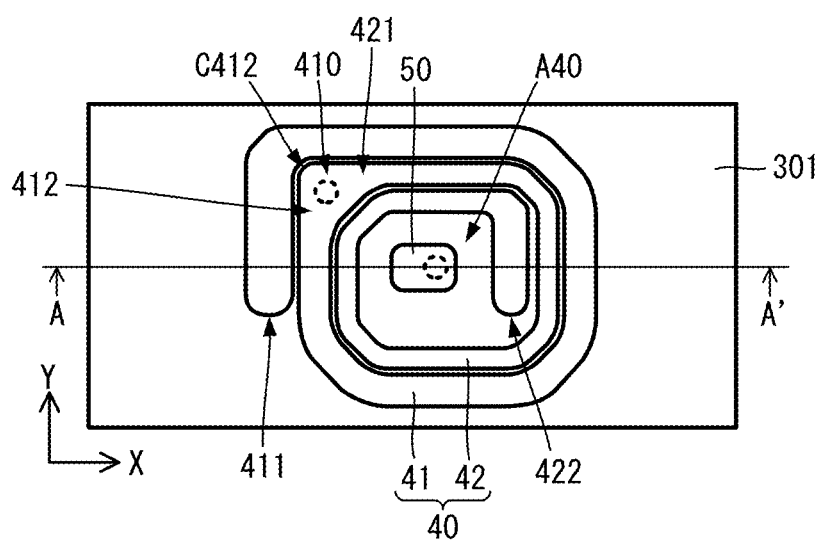
Figure 4C:
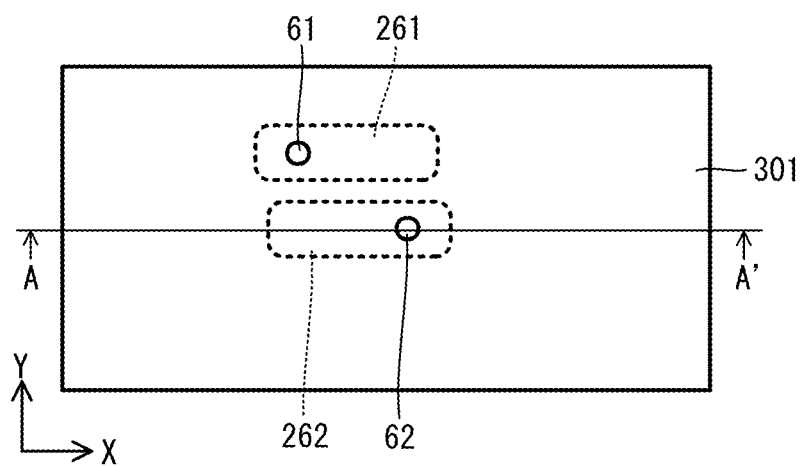
Figure 5:
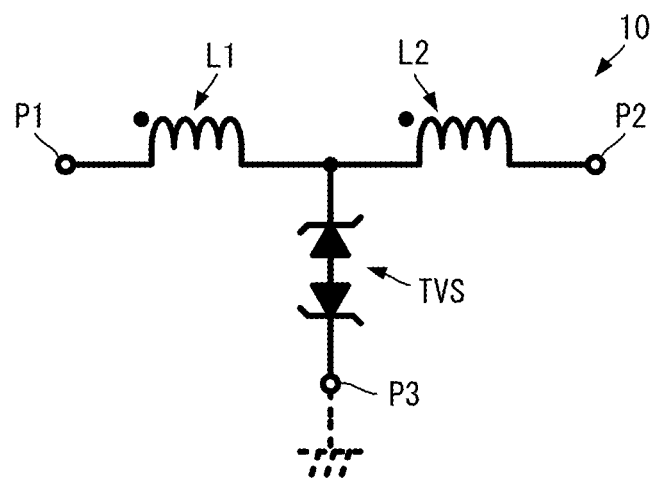
FIG. 5 is an equivalent circuit diagram of the ESD protection element 10 according to the first exemplary embodiment.

An ESD protection element according to a first exemplary embodiment will be described with reference to the drawings. FIG. 1A is a perspective view of the ESD protection element according to the first exemplary embodiment, and FIG. 1B is a view showing a schematic structure of a conductor pattern of the ESD protection element. FIG. 2 is a cross-sectional side view of the ESD protection element according to the first exemplary embodiment. FIG. 3A, FIG. 3B, FIG. 3C, FIG. 4A, FIG. 4B, and FIG. 4C are views each showing a portion of an exploded plan view of the ESD protection element according to the first exemplary embodiment. FIG. 5 is an equivalent circuit diagram of the ESD protection element according to the first exemplary embodiment. The side cross-section shown in FIG. 2 shows an A-A' cross-section shown in FIG. 3A, FIG. 3B, FIG. 3C, FIG. 4A, FIG. 4B, and FIG. 4C.

Circuit Configuration

First, a circuit configuration of an ESD protection element 10 will be described with reference to FIG. 5. As shown in FIG. 5, the ESD protection element 10 includes an inductor L1, an inductor L2, and a surge absorbing element TVS (Transient Voltage Suppressor). The surge absorbing element TVS includes a Zener diode. The ESD protection element 10 includes a first external connection terminal P1, a second external connection terminal P2, and a third external connection terminal P3.

The inductor L1 and the inductor L2 are connected to each other. A connecting portion at which this inductor L1 and the inductor L2 are connected to each other corresponds to a portion at which a connection conductor portion 410 to be described below is disposed. As shown, the inductor L1 and the inductor L2 are connected in series in this order from the first external connection terminal P1 toward the second external connection terminal P2. In other words, one end of the inductor L1 is connected to the first external connection terminal P1, and the other end of the inductor L1 is connected to one end of the inductor L2 through the connecting portion. Moreover, the other end of the inductor L2 is connected to the second external connection terminal P2.

The connecting portion at which the inductor L1 and the inductor L2 are connected to each other is connected to the third external connection terminal P3 through the surge absorbing element TVS. The third external connection terminal P3 is connected to a ground potential, for example.

With this configuration, the ESD protection element 10 uses the first external connection terminal P1 and the second external connection terminal P2 as an input and output terminal of a high-frequency signal, and achieves an ESD (Electro Static Discharge) protection function and an LPF (Low Pass Filter) function. In such a case, the inductor L1 and the inductor L2 are electromagnetically coupled to each other. As a result, desired characteristics are able to be obtained while the shape of the inductor L1 and the inductor L2 is reduced.

Structure

As shown in FIG. 1A, FIG. 1B, FIG. 2, FIG. 3A, FIG. 3B, FIG. 3C, FIG. 4A, FIG. 4B, and FIG. 4C, the ESD protection element 10 includes a semiconductor substrate 20 and a wiring layer 30 as a structure.

The semiconductor substrate 20 is a substrate that includes a semiconductor region. The surge absorbing element TVS is provided (i.e., formed or disposed) in the semiconductor region. Moreover, while in the present exemplary embodiment, the semiconductor region is provided in the entirety of the semiconductor substrate 20, the semiconductor region may be provided in at least a portion of the semiconductor substrate. The semiconductor substrate 20 includes a terminal provided surface 201 (that is a surface of the semiconductor substrate) in parallel to the X direction and the Y direction and a back surface 202 of the semiconductor substrate. The terminal provided surface 201 and the back surface 202 of the semiconductor substrate are spaced apart in a predetermined distance in the direction of Z. A distance in the Z direction corresponds to a thickness of the semiconductor substrate 20.

The semiconductor substrate 20 includes a first terminal conductor 261 and a second terminal conductor 262. In other words, the first terminal conductor 261 and the second terminal conductor 262 are provided on the terminal provided surface 201 of the semiconductor substrate 20. While the specific internal structure of the semiconductor substrate 20 will be described later, a Zener diode electrically connected to the first terminal conductor 261 and the second terminal conductor 262 is provided inside the semiconductor substrate 20.

As further shown, the wiring layer 30 is provided on the semiconductor substrate 20. In other words, the wiring layer 30 is provided (or formed) on the terminal provided surface 201 of the semiconductor substrate 20. The wiring layer 30 includes an insulating layer 301, an insulating layer 302, and an insulating layer 303. The insulating layer 301, the insulating layer 302, and the insulating layer 303 are provided in this order from the terminal provided surface 201.

The wiring layer 30 includes an inductor conductor 40, a wiring conductor 50, an interlayer connection conductor 61, an interlayer connection conductor 62, an interlayer connection conductor 71, an interlayer connection conductor 72, an interlayer connection conductor 73, a wiring conductor 81, a wiring conductor 82, and a wiring conductor 83.

The inductor conductor 40 is a spiral-shaped conductor pattern. More specifically, the inductor conductor 40 has a spiral shape in a plan view (as viewed in a direction perpendicular to the X direction and the Y direction, that is, a direction in parallel to the Z direction) of the semiconductor substrate 20. It is to be noted that, while the first exemplary embodiment describes an example in which the inductor conductor 40 has a two-dimensional spiral shape, the inductor conductor 40 may have a three-dimensional spiral shape. In other words, for example, the inductor conductor 40 is provided over a plurality of layers, and divided portions of the inductor conductor 40 may be connected to each other by the interlayer connection conductor.

As further shown, the inductor conductor 40 includes a first inductor conductor 41, a second inductor conductor 42, and a connection conductor portion 410. The first inductor conductor 41 and the second inductor conductor 42 are connected in series. In such a case, the first inductor conductor 41 is disposed on an outer peripheral side of the second inductor conductor 42. The connection conductor portion 410 is disposed at a portion at which the first inductor conductor 41 and the second inductor conductor 42 are connected to each other. In other words, the connection conductor portion 410 connects the first inductor conductor 41 and the second inductor conductor 42. It is further noted that a specific shape of the inductor conductor 40 will be described later.

The inductor conductor 40 is provided on a boundary surface between the insulating layer 301 and the insulating layer 302, as shown in FIG. 2, for example.

The wiring conductor 50 has a substantially rectangular shape, and is provided on the boundary surface between the insulating layer 301 and the insulating layer 302. In other words, the wiring conductor 50 is provided on the same surface on which the inductor conductor 40 is provided. The wiring conductor 50, in the plan view of the semiconductor substrate 20, is disposed inside a central opening A40 being an opening of the inductor conductor 40. The wiring conductor 50, in the plan view of the semiconductor substrate 20, is disposed substantially in the center of the central opening A40, and is spaced apart from the inductor conductor 40.

The interlayer connection conductor 61 and the interlayer connection conductor 62 are rod-shaped conductors (via conductors) that pass through the insulating layer 301 in a thickness direction (the Z direction). The interlayer connection conductor 61 connects the connection conductor portion 410 and the first terminal conductor 261. The interlayer connection conductor 62 connects the wiring conductor 50 and the second terminal conductor 262.

The wiring conductor 81, the wiring conductor 82, and the wiring conductor 83 are provided on the boundary surface between the insulating layer 302 and the insulating layer 303. The wiring conductor 81, the wiring conductor 83, and the wiring conductor 82 are disposed in this order in the X direction. The wiring conductor 81 and the wiring conductor 83, and the wiring conductor 83 and the wiring conductor 82, as shown in FIG. 4A to FIG. 4C, are spaced apart from each other in the X direction.

The interlayer connection conductor 71, the interlayer connection conductor 72, and the interlayer connection conductor 73 are rod-shaped conductors that pass through the insulating layer 302 in the thickness direction (the Z direction). The interlayer connection conductor 71 connects a first end portion 411 (i.e., corresponding to the outer peripheral end of the inductor conductor 40) of the first inductor conductor 41 and the wiring conductor 81. The interlayer connection conductor 72 connects a second end portion 422 (i.e., corresponding to the inner peripheral end of the inductor conductor 40) of the second inductor conductor 42 and the wiring conductor 82. The interlayer connection conductor 73 connects the wiring conductor 50 and the wiring conductor 83.

The insulating layer 303 includes an opening portion 812, an opening portion 822, and an opening portion 832. The opening portion 812, in the plan view of the semiconductor substrate 20, overlaps with a portion of the wiring conductor 81, and includes a metal film 811. The opening portion 822, in the plan view of the semiconductor substrate 20, overlaps with a portion of the wiring conductor 82, and includes a metal film 821. The opening portion 832, in the plan view of the semiconductor substrate 20, overlaps with a portion of the wiring conductor 83, and includes a metal film 831. The metal film 811, the metal film 821, and the metal film 831 are nickel/Au plated, for example. According to the exemplary embodiment, a portion of the metal film 811 corresponds to the first external connection terminal P1, a portion of the metal film 821 corresponds to the second external connection terminal P2, and a portion of the metal film 831 corresponds to the third external connection terminal P3.

Figure 6:
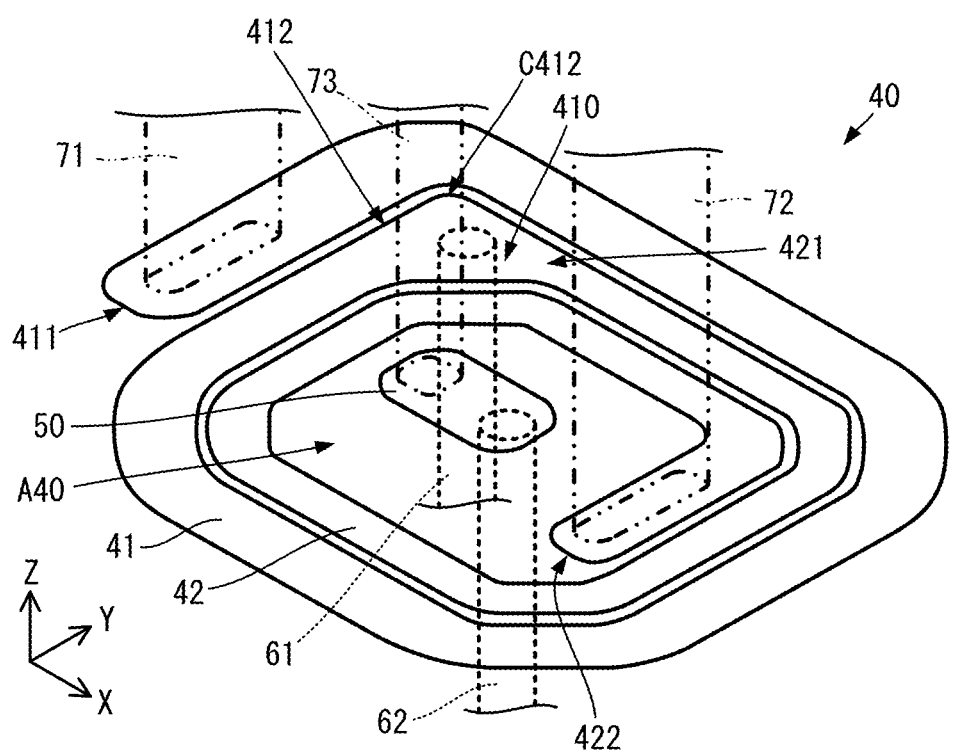
FIG. 6 is a perspective view of an inductor conductor 40 according to the first exemplary embodiment.
Figure 7:
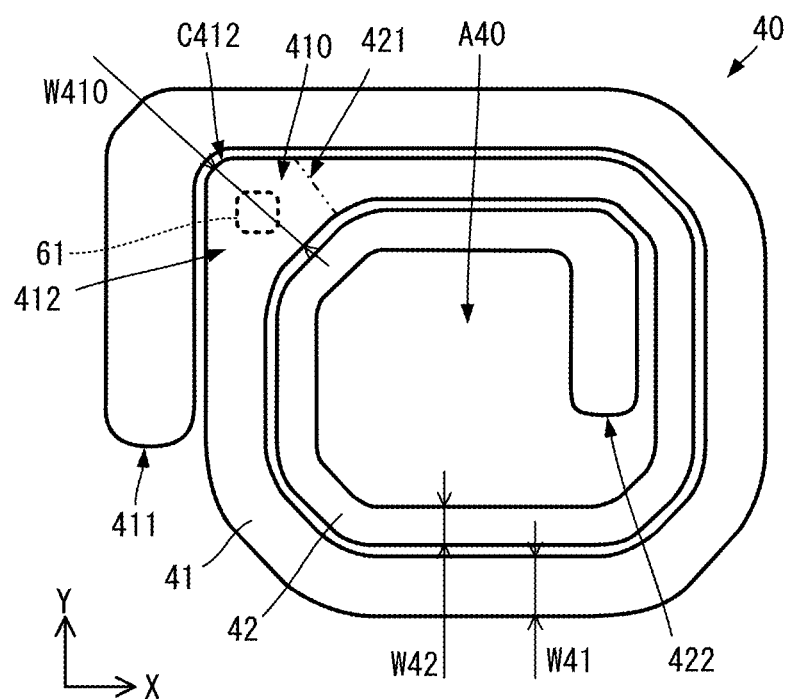
FIG. 7 is a plan view of the inductor conductor 40 according to the first exemplary embodiment.

In such a configuration, as shown in FIG. 6 and FIG. 7, the inductor conductor 40 includes the following configuration.

As described above, the inductor conductor 40, in the plan view of the semiconductor substrate 20, has a spiral shape and includes the first inductor conductor 41, the second inductor conductor 42, and the connection conductor portion 410.

Moreover, according to the exemplary aspect, the first inductor conductor 41 and the second inductor conductor 42 are connected in series in this order from a side (i.e., the outer peripheral end of the inductor conductor 40) of the outer peripheral end of the spiral shape toward a side (i.e., the inner peripheral end of the inductor conductor 40) of the inner peripheral end of the spiral shape. In other words, the first inductor conductor 41 is disposed on the outer peripheral side of the second inductor conductor 42. Moreover, the outer peripheral portion of the inductor conductor 40 is the first inductor conductor 41, and the inner peripheral portion of the inductor conductor 40 is the second inductor conductor 42.

The first inductor conductor 41 includes the first end portion 411 on one end in an extending direction and a second end portion 412 on the other end in the extending direction. The second inductor conductor 42 includes a first end portion 421 on one end in an extending direction and the second end portion 422 on the other end in the extending direction. It is noted that according to the exemplary embodiment, the first end portion 411 of the first inductor conductor 41 corresponds to the outer peripheral end of the inductor conductor 40 and the second end portion 422 of the second inductor conductor 42 corresponds to the inner peripheral end of the inductor conductor 40.

The second end portion 412 of the first inductor conductor 41 and the first end portion 421 of the second inductor conductor 42 are connected to each other through the connection conductor portion 410. In other words, the connection conductor portion 410 is disposed at a portion at which the second end portion 412 of the first inductor conductor 41 and the first end portion 421 of the second inductor conductor 42 are connected to each other.

According to an exemplary aspect as shown in FIG. 7, a width W42 of the second inductor conductor 42 is smaller than a width W41 of the first inductor conductor 41 (W42<W41). In other words, the width W41 of the first inductor conductor 41 is larger than the width W42 of the second inductor conductor 42 (W41>W42).

With this configuration, the inductance (i.e., the inductance of the inductor L1) of the first inductor conductor 41, and the inductance (i.e., the inductance of the inductor L2) of the second inductor conductor 42 can be substantially equal to each other.

This is because of the following reasons. As with the configuration of the present application, in a configuration in which the first inductor conductor 41 is disposed on the outer peripheral side of the second inductor conductor 42, the opening of the first inductor conductor 41 is larger than the opening of the second inductor conductor 42. In such a case, when the width of the first inductor conductor 41 is equal to the width of the second inductor conductor 42, the inductance (the inductance of the inductor L1) of the first inductor conductor 41 is larger than the inductance (the inductance of the inductor L2) of the second inductor conductor 42.

However, in the configuration of the exemplary embodiment, since the width W42 of the second inductor conductor 42 is smaller than the width W41 of the first inductor conductor 41 (the width W41 of the first inductor conductor 41 is larger than the width W42 of the second inductor conductor 42), the inductance (the inductance of the inductor L1) of the first inductor conductor 41 can be reduced. Accordingly, the inductance (the inductance of the inductor L1) of the first inductor conductor 41 and the inductance (the inductance of the inductor L2) of the second inductor conductor 42 can be brought closer and are able to be substantially equal to each other.

In this manner, the inductance of the inductor L1 and the inductance of the inductor L2 are closer (substantially equal) to each other, so that the first impedance when the ESD protection element 10 is viewed from the first external connection terminal P1, and the second impedance when the ESD protection element 10 is viewed from the second external connection terminal P2 are able to be brought closer and substantially equal (50Ω, for example) to each other. As a result, impedance to other circuit components (an antenna and an RF module, for example) to be connected to the first external connection terminal P1 and the second external connection terminal P2 through the ESD protection element 10 is matched. Therefore, degradation of the transmission characteristics can be significantly reduced or prevented altogether.

It is noted that the width W42 of the second inductor conductor 42 and the width W41 of the first inductor conductor 41 are determined, for example, as shown below. First, the width W42 of the second inductor conductor 42 and the width W41 of the first inductor conductor 41 are made equal, and a shape (e.g., a length or an area of the central opening A40) of each of the first inductor conductor 41 and the second inductor conductor 42 is determined. Subsequently, the width W42 of the second inductor conductor 42 is reduced, and the width W41 of the first inductor conductor 41 is increased. As a result, while a desired inductance as the inductor L2 and the inductor L1 is obtained, the inductance of the inductor L2 and the inductance of the inductor L1 are made substantially equal.

Furthermore, in the configuration of the first exemplary embodiment, the width W42 of the second inductor conductor 42 is reduced, so that the area of the central opening A40 is able to be increased, as compared with the configuration in which the width of the first inductor conductor 41 is equal to the width of the second inductor conductor 42. Therefore, the inductance due to a reduction in area of the central opening A40 is able to be significantly reduced or prevented, and a reduction in coupling coefficient of the inductor L1 and the inductor L2 is able to be significantly reduced or prevented.

Moreover, in the configuration of the first exemplary embodiment, as compared with the configuration in which the width of the first inductor conductor 41 and the width of the second inductor conductor 42 are equal to each other, the width W42 of the second inductor conductor 42 is made smaller than the width W41 of the first inductor conductor 41, which is able to reduce a plane area. As a result, the ESD protection element 10 can be reduced in size.

Furthermore, in the configuration of the first exemplary embodiment, a width W410 of the connection conductor portion 410 is larger than the width W41 of the first inductor conductor 41. In this configuration, the cross-sectional area of the interlayer connection conductor 61 can be increased. As a result, resistance by the interlayer connection conductor 61 can be reduced, and the transmission loss is significantly reduced or prevented altogether. In addition, since the interlayer connection conductor of the ESD protection element passes a surge current, the interlayer connection conductor is generally preferably thick (large in cross-sectional area), and the thickness of the interlayer connection conductor 61 can be secured by the configuration of the first exemplary embodiment.

In addition, in the configuration of the first exemplary embodiment, the connection conductor portion 410 is disposed at a portion at which the first inductor conductor 41 and the second inductor conductor 42 are connected to each other. As a result, even when the width W410 of the connection conductor portion 410 is large, adverse effects may not be caused on the characteristics of the first inductor conductor 41 and the second inductor conductor 42. Therefore, the inductor L1 and the inductor L2 both having excellent characteristics can be obtained.

Furthermore, in the configuration of the first exemplary embodiment, the connection conductor portion 410 is disposed at a corner portion C412 of the inductor conductor 40 having a spiral shape. As a result, even when the width W410 of the connection conductor portion 410 is large, as with a case in which the connection conductor portion 410 is disposed at a straight portion of the inductor conductor 40, a reduction in area of the central opening A40 is significantly reduced or prevented. As a result, the disturbance of the magnetic flux that passes through the inductor L1 and the inductor L2 is significantly reduced or prevented altogether. Therefore, a reduction in coupling coefficient of the inductor L1 and the inductor L2, a reduction in inductance, and degradation of the Q value are significantly reduced or prevented. Consequently, the inductor L1 and the inductor L2 both having excellent characteristics can be obtained.

Moreover, in this configuration, the corner portion of the spiral shape is round chamfered. In the first exemplary embodiment, round chamfering is performed to configure a corner portion such that the corner portion may not be right angled (i.e., may not be bent at an acute angle). More specifically, for example, the corner portion is not bent at a right angle, but may be bent smoothly or may be bent at 90 degrees by a plurality of times of bending. As a result, a loss caused by concentration of an electric field on the corner portion is significantly reduced or prevented. Therefore, the ESD protection element having excellent characteristics can be obtained.

It is to be noted that, in the above description, all the width W41 of the first inductor conductor 41 does not have to be equal in the extending direction. Similarly, all the width W42 of the second inductor conductor 42 does not have to be equal in the extending direction. For example, under the conditions that a width of a portion of the second inductor conductor 42 configured to greatly contribute to the characteristics may be set to the width W42 and a width of a portion of the first inductor conductor 41 configured to greatly contribute to the characteristics may be set to the width W41, such a condition that the width W42 is smaller than the width W41 may be satisfied. Alternatively, for example, under the conditions that an average width of the second inductor conductor 42 may be set to the width W42 and an average width of the first inductor conductor 41 may be set to the width W41, the condition that the width W42 is smaller than the width W41 may be satisfied.

Figure 8A:
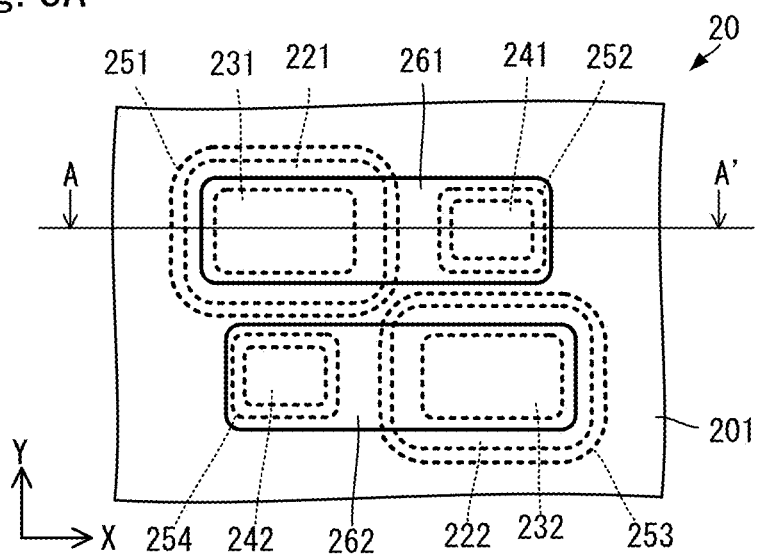
FIG. 8A is a partial plan view of a semiconductor substrate 20 according to the first exemplary embodiment.
Figure 8B:
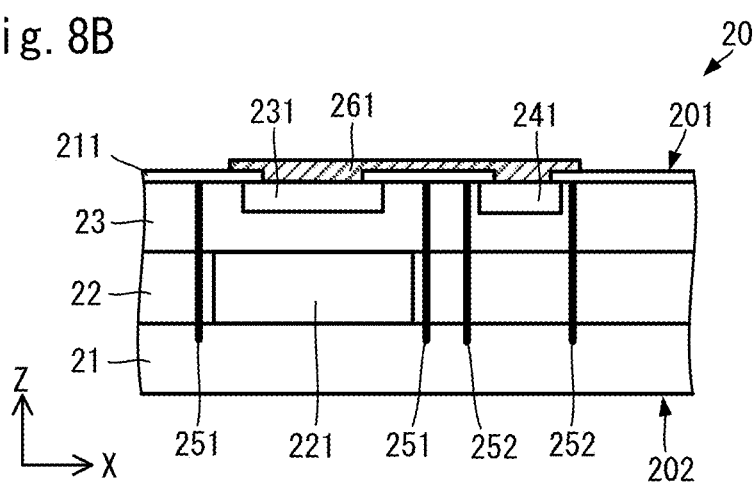
FIG. 8B is a partial cross-sectional view of the semiconductor substrate 20.
Figure 8C:
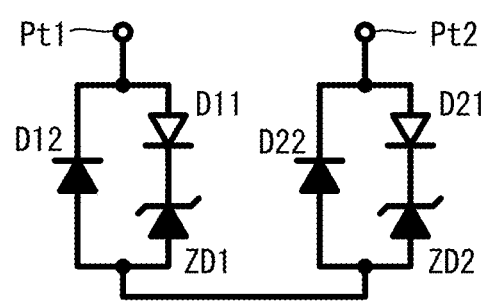
FIG. 8C is an equivalent circuit diagram of the semiconductor substrate 20.

It is to be noted that the semiconductor substrate 20 has the following structure. FIG. 8A is a partial plan view of the semiconductor substrate 20 according to the first exemplary embodiment, FIG. 8B is a partial cross-sectional view of the semiconductor substrate 20, and FIG. 8C is an equivalent circuit diagram of the semiconductor substrate 20. It is noted that the semiconductor substrate 20 corresponds to the "substrate" of the present disclosure.

As described above, the semiconductor substrate 20 includes the terminal provided surface 201 and the back surface 202 of the semiconductor substrate that are parallel to the X direction and Y direction. The semiconductor substrate 20 includes the first terminal conductor 261 and the second terminal conductor 262. The first terminal conductor 261 and the second terminal conductor 262 are provided on the terminal provided surface 201.

According to an exemplary aspect, the semiconductor substrate 20 includes a P-sub layer 21, an N-epitaxial layer 22, an N-epitaxial layer 23, and a passivation layer 211. In addition, the semiconductor substrate 20 includes an NBL 221, an NBL 222, a P-type doping portion 231, a P-type doping portion 232, an N-type doping portion 241, an N-type doping portion 242, a trench 251, a trench 252, a trench 253, and a trench 254. Moreover, it should be appreciated that the semiconductor substrate 20 can be formed by the known semiconductor manufacturing process as would be appreciated to one skilled in the art.

The N-epitaxial layer 22 is provided on a surface (i.e., a side opposite to the back surface 202 of the semiconductor substrate) of the P-sub layer 21, and the N-epitaxial layer 23 is provided on a surface (i.e., a side opposite to a side in contact with or opposed to the P-sub layer 21) of the N-epitaxial layer 22. The N-epitaxial layer 23 and the N-epitaxial layer 22 are different in the doping amount of N-type impurities. The passivation layer 211 is an insulating layer and is provided on a surface (i.e., a side opposite to a side in contact with or opposed to the N-epitaxial layer 22) of the N-epitaxial layer 23.

The NBL 221 is a so-called N-type buried layer, and is provided on the N-epitaxial layer 22.

The P-type doping portion 231 and the N-type doping portion 241 are provided on the N-epitaxial layer 23. The P-type doping portion 231 and the N-type doping portion 241 are provided in a predetermined depth from the surface of the N-epitaxial layer 23.

In the plan view of the semiconductor substrate 20, the P-type doping portion 231 and the N-type doping portion 241 are spaced apart from each other. In the plan view of the semiconductor substrate 20, the P-type doping portion 231 and the NBL 221 overlap with each other. In such a case, the area of the NBL 221 is larger than the area of the P-type doping portion 231.

The trench 251 and the trench 252 may be insulators, pass through the N-epitaxial layer 23 and the N-epitaxial layer 22 in the thickness direction of the semiconductor substrate 20, and reach to the predetermined depth in the P-sub layer 21.

The trench 251, in the plan view of the semiconductor substrate 20, has a shape surrounding the periphery of the P-type doping portion 231 and the NBL 221.

The trench 252, in the plan view of the semiconductor substrate 20, has a shape surrounding the periphery of the N-type doping portion 241.

As shown in FIG. 8B, the first terminal conductor 261 includes a portion provided on a surface of the passivation layer 211. In the plan view of the semiconductor substrate 20, the first terminal conductor 261 at least partially overlaps with the P-type doping portion 231 and the N-type doping portion 241. In addition, the first terminal conductor 261 is connected to the P-type doping portion 231 and the N-type doping portion 241 through an opening of the passivation layer 211.

It is to be noted that, although not illustrated in detail, in a structure similar to the structure under the first terminal conductor 261, the NBL 222, the P-type doping portion 232, the N-type doping portion 242, the trench 253, and the trench 254 are also provided under the second terminal conductor 262.

With this configuration, the semiconductor substrate 20 achieves a circuit configuration as shown in FIG. 8C. The semiconductor substrate 20 includes a terminal Pt1, a terminal Pt2, a diode D11, a diode D12, a diode D21, a diode D22, a Zener diode ZD1, and a Zener diode ZD2. The terminal Pt1 is provided by using the first terminal conductor 261, and the terminal Pt2 is provided by using the second terminal conductor 262.

The anode of the diode D11 and the cathode of the diode D12 are connected to the terminal Pt1. The cathode of the diode D11 is connected to the cathode of the Zener diode ZD1. The anode of the Zener diode ZD1 and the anode of the diode D12 are connected to the anode of the Zener diode ZD2 and the anode of the diode D22. This connection path (a path that connects the anode of the Zener diode ZD1 and the anode of the diode D12, and the anode of the Zener diode ZD2 and the anode of the diode D22) is provided by the P-sub layer 21.

The cathode of the Zener diode ZD1 is connected to the cathode of the diode D11. The anode of the diode D21 and the cathode of the diode D22 are connected to the terminal Pt2.

With this configuration, the semiconductor substrate 20 achieves a surge absorbing element TVS including the Zener diode. As shown in FIG. 8A and FIG. 8B, the first terminal conductor 261 and the second terminal conductor 262 that have a predetermined area and a predetermined shape are provided, so that connection between the surge absorbing element TVS and the inductor conductor 40 through the interlayer connection conductor and connection the surge absorbing element TVS and the wiring conductor 83 through the interlayer connection conductor are more reliably and easily performed.

Figure 9:
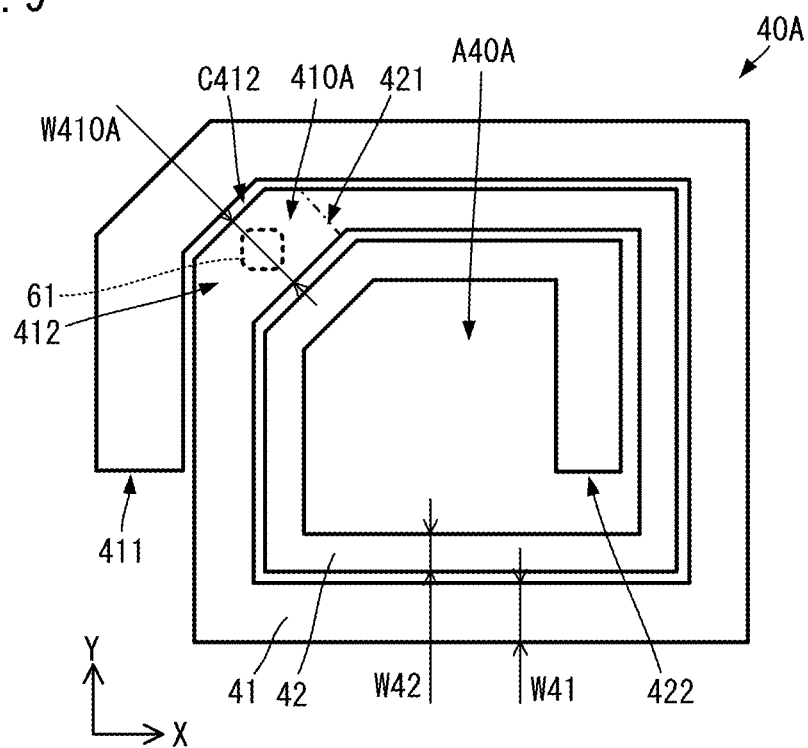
FIG. 9 is a plan view showing a shape of an inductor conductor 40A of an ESD protection element according to a second exemplary embodiment.

Next, an ESD protection element according to a second exemplary embodiment will be described with reference to the drawings. FIG. 9 is a plan view showing a shape of an inductor conductor of the ESD protection element according to the second exemplary embodiment.

The ESD protection element according to the second exemplary embodiment is different in the shape of an inductor conductor 40A from the ESD protection element 10 according to the first exemplary embodiment. Other configurations of the ESD protection element according to the second exemplary embodiment are the same as or similar to the configurations of the ESD protection element 10, and a description of the same or similar configuration will be omitted.

As shown in FIG. 9, in a plan view, the inductor conductor 40A has corner portions of approximately 90 degrees except for the corner portion C412 in one direction from the central opening A40A. The inductor conductor 40A has a bent portion that is bent by two corners larger than 90 degrees at the corner portion C412. In other words, the corner portion C412 of the inductor conductor 40A is round chamfered. The bent portion defines a connection conductor portion 410A.

A width W410A of the connection conductor portion 410A is larger than the width W41 of the first inductor conductor 41.

Even with such a configuration, the same or similar operational features are able to be provided as the first exemplary embodiment. In addition, with this configuration, a loss caused by concentration of an electric field on the corner portions is significantly reduced or prevented. Therefore, the ESD protection element having more excellent characteristics is able to be obtained.

Figure 10:
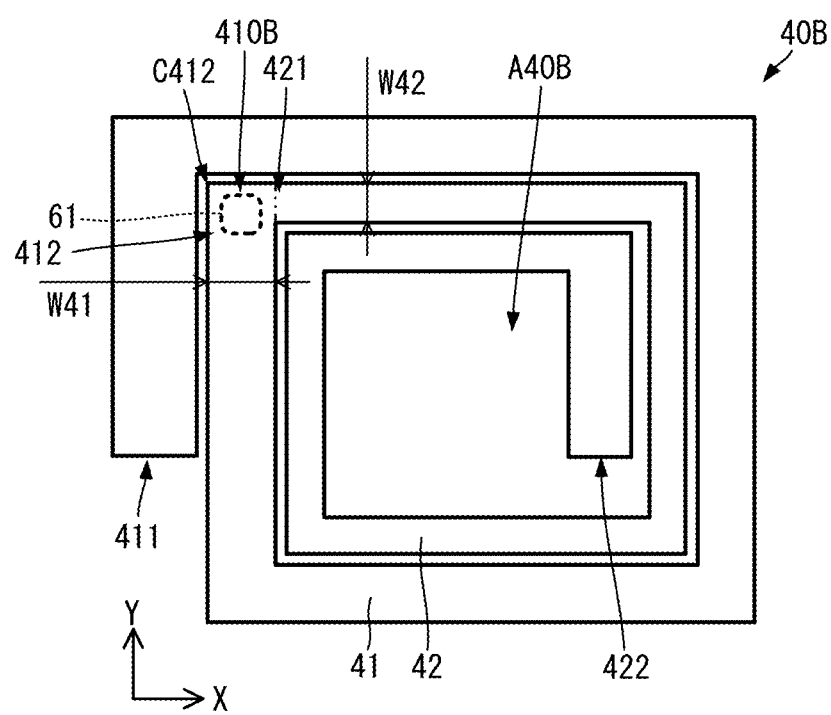
FIG. 10 is a plan view showing a shape of an inductor conductor 40B of an ESD protection element according to a third exemplary embodiment.

Next, an ESD protection element according to a third exemplary embodiment will be described with reference to the drawings. FIG. 10 is a plan view showing a shape of an inductor conductor of the ESD protection element according to the third exemplary embodiment.

The ESD protection element according to the third exemplary embodiment is different in the shape of an inductor conductor 40B from the ESD protection element 10 according to the first exemplary embodiment. It is noted that other configurations of the ESD protection element according to the third exemplary embodiment are the same as or similar to the configurations of the ESD protection element 10, and a description of the same or similar configuration will be omitted.

As shown in FIG. 10, in a plan view, the inductor conductor 40B is a rectangle (a central opening A40B is a rectangle) including each corner portion of approximately 90 degrees. In other words, the inductor conductor 40B does not have a round chamfered corner portion. In such a case, a connection conductor portion 410B is provided at one corner portion.

Even with such a configuration, the same or similar operational features are able to be provided as the first exemplary embodiment.

Figure 11:
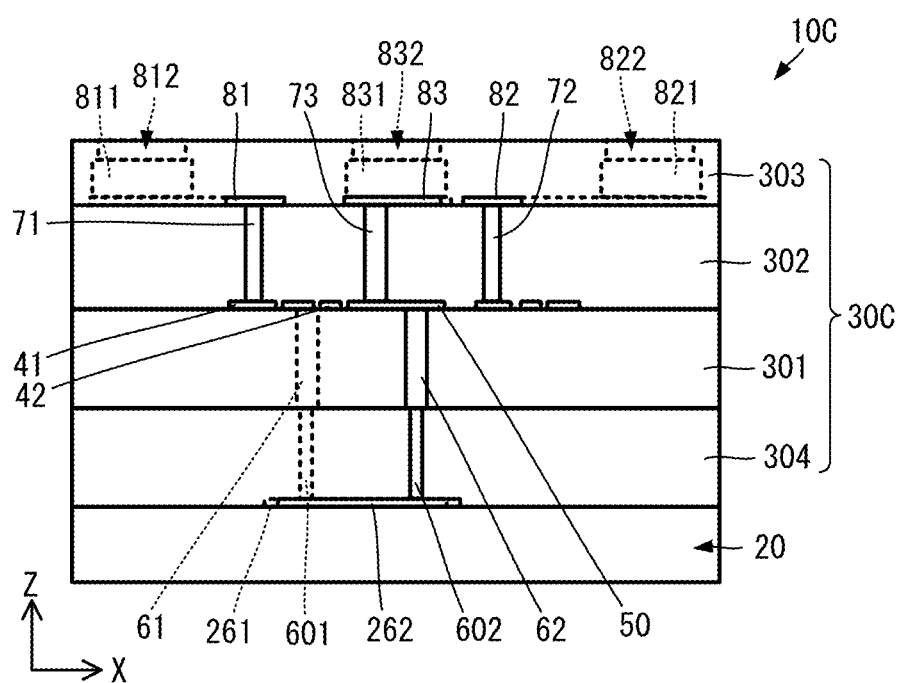
FIG. 11 is a cross-sectional view of an ESD protection element 10C according to a fourth exemplary embodiment.

Next, an ESD protection element according to a fourth exemplary embodiment will be described with reference to the drawings. FIG. 11 is a cross-sectional view of the ESD protection element according to the fourth exemplary embodiment.

As shown in FIG. 11, the ESD protection elements 10C according to the fourth exemplary embodiment is different in configuration of a wiring layer 30C from the ESD protection element 10 according to the first exemplary embodiment. It is noted that other configurations of the ESD protection element 10C are the same as or similar to the configurations of the ESD protection element 10, and a description of the same or similar configuration will be omitted.

The wiring layers 30C is different from the wiring layer 30 in that an insulating layer 304, an interlayer connection conductor 601, and an interlayer connection conductor 602 are added. It is noted that other configurations of the wiring layer 30C are the same as or similar to the configurations of the wiring layer 30, and a description of the same or similar configuration will be omitted.

The insulating layer 304 is disposed between the semiconductor substrate 20 and the insulating layer 301. The interlayer connection conductor 601 and the interlayer connection conductor 602 pass through the insulating layer 304 in the thickness direction (the Z direction). The interlayer connection conductor 601 connects the first terminal conductor 261 and the interlayer connection conductor 61. The interlayer connection conductor 602 connects the second terminal conductor 262 and the interlayer connection conductor 62.

In this configuration, the inductor conductor 40 and the semiconductor substrate 20 are further spaced apart by a distance equal to the thickness of the insulating layer 304. As a result, the effect of the semiconductor substrate 20 on the inductor conductor 40 is able to be significantly reduced or prevented. Therefore, the characteristics of the inductor L1 and the inductor L2 are improved, and the ESD protection element 10C having more excellent characteristics is able to be obtained.

Figure 12A:
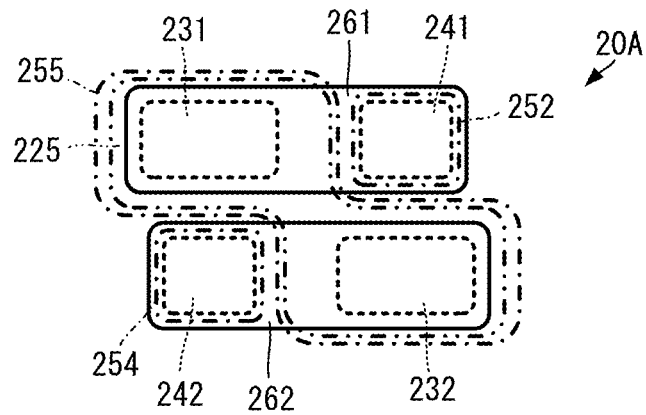
FIG. 12A, FIG. 12B, and FIG. 12C are views each showing a derived example of a semiconductor substrate.
Figure 12B:
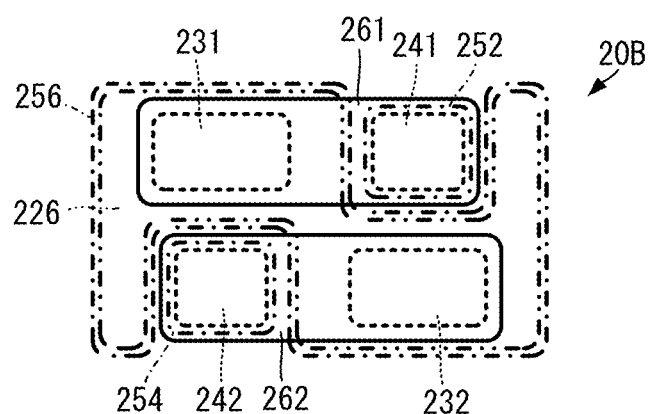
Figure 12C:
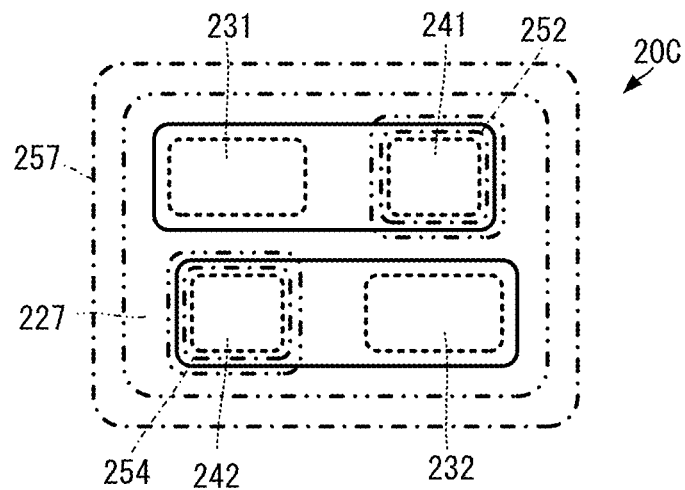

It is to be noted that the semiconductor substrate 20 may include the following configuration. FIG. 12A, FIG. 12B, and FIG. 12C are views each showing a derived example of a semiconductor substrate. FIG. 12A, FIG. 12B, and FIG. 12C omit the illustration of a main portion of the semiconductor substrate 20 as a substrate but illustrate a positional relationship of each functional portion.

A semiconductor substrate 20A shown in FIG. 12A is different in the shape of an NBL 225 and a trench 255 from the semiconductor substrate 20 shown in FIG. 8A and FIG. 8B. Other configurations of the semiconductor substrate 20A are the same as or similar to the configurations of the semiconductor substrate 20, and a description of the same or similar configuration will be omitted.

The NBL 225, in the plan view of the semiconductor substrate 20A, overlaps with both the P-type doping portion 231 that overlaps with the first terminal conductor 261, and the P-type doping portion 232 that overlaps with the second terminal conductor 262.

The trench 255, in the plan view of the semiconductor substrate 20A, has a shape surrounding the periphery of the NBL 225.

A semiconductor substrate 20B shown in FIG. 12B is different in the shape of an NBL 226 and a trench 256 from the semiconductor substrate 20A shown in FIG. 12A. Other configurations of the semiconductor substrate 20B are the same as or similar to the configurations of the semiconductor substrate 20A, and a description of the same or similar configuration will be omitted.

The NBL 226, in the plan view of the semiconductor substrate 20B, overlaps with both the P-type doping portion 231 that overlaps with the first terminal conductor 261, and the P-type doping portion 232 that overlaps with the second terminal conductor 262. Furthermore, the NBL 226, in the plan view of the semiconductor substrate 20B, surrounds three sides of the N-type doping portion 241 and the N-type doping portion 242.

The trench 256, in the plan view of the semiconductor substrate 20B, has a shape surrounding the periphery of the NBL 226.

A semiconductor substrate 20C shown in FIG. 12C is different in the shape of an NBL 227 and a trench 257 from the semiconductor substrate 20A shown in FIG. 12A. Other configurations of the semiconductor substrate 20C are the same as or similar to the configurations of the semiconductor substrate 20A, and a description of the same or similar configuration will be omitted.

The NBL 227, in the plan view of the semiconductor substrate 20C, overlaps with both the P-type doping portion 231 that overlaps with the first terminal conductor 261, and the P-type doping portion 232 that overlaps with the second terminal conductor 262. Furthermore, the NBL 227, in the plan view of the semiconductor substrate 20C, surrounds a front side of the N-type doping portion 241 and the N-type doping portion 242. In other words, the NBL 227, in the plan view of the semiconductor substrate 20C, has an opening in a portion that overlaps with the N-type doping portion 241, the N-type doping portion 242, the trench 252, and the trench 254.

The trench 257, in the plan view of the semiconductor substrate 20C, has a shape surrounding the periphery of the NBL 227.

The area of a Zener diode is able to be changed by properly using the configuration shown in FIG. 12A, FIG. 12B, and FIG. 12C. An on-resistance value of a Zener diode is able to be changed by changing the area of a Zener diode. For example, an on-resistance value is able to be reduced by increasing the area of a Zener diode. On the other hand, a capacitance value is easily controlled by reducing the area of a Zener diode. In other words, according to necessary on-control and precision of a capacitance value, by properly using the configuration, a desired ESD protection element is able to be reliably obtained.

The above described exemplary embodiments are to be considered in all respects as illustrative and not restrictive. It is to be understood that variations and modifications will be apparent to those skilled in the art.

For example, while each of the above-described exemplary embodiments shows an example in which the terminal conductor includes two terminal conductors (a first terminal conductor and a second terminal conductor), the terminal conductor may include three or more terminal conductors. In addition, the terminal conductor does not necessarily need to have a planar shape and may have a linear shape. Furthermore, while an example in which all of the plurality of terminal conductors are disposed on the terminal provided surface, it is noted that the exemplary embodiments of the present invention is not limited to this example. For example, the first terminal conductor and the second terminal conductor may be provided on mutually different layers.

Moreover, while each of the above-described exemplary embodiments shows an example in which the connection conductor portion is disposed at the corner portion of the inductor conductor, it is noted that the exemplary embodiments of the present invention is not limited to this example. The connection conductor portion may be disposed at a portion other than the corner portion of the inductor conductor.

In addition, for example, while each of the above-described exemplary embodiments, as shown in FIG. 8C, shows an example in which the configuration including two Zener diodes provides the surge absorbing element TVS, it is noted that the exemplary embodiments of the present invention is not limited to this example. As long as the semiconductor region includes a P-type semiconductor region and an N-type semiconductor region so that a breakdown voltage may occur bi-directionally, the surge absorbing element TVS is able to be obtained. For example, a configuration including an N-type MOSFET or a p-type transistor may be used. Furthermore, without using the semiconductor substrate, a substrate including single-crystal silicon may be used or a substrate mainly made of ceramics or glass and utilizing discharge gap may be used.

What is claimed:

1. An ESD protection element comprising:
a substrate including a semiconductor region having a surge absorbing element;
a wiring layer disposed on the substrate;
an inductor conductor disposed in the wiring layer and having a spiral shape in a plan view of the wiring layer and that includes an outer peripheral end and an inner peripheral end; and
first, second and third external connection terminals disposed in or on the wiring layer;
wherein the inductor conductor includes:
a first inductor conductor disposed on an outer peripheral side that includes the outer peripheral end;
a second inductor conductor disposed on an inner peripheral side that includes the inner peripheral end; and
a connection conductor that connects the first inductor conductor to the second inductor conductor;
wherein the outer peripheral end of the inductor conductor is directly connected to the first external connection terminal;
wherein the inner peripheral end of the inductor conductor is connected to the second external connection terminal;
wherein the third external connection terminal is connected to the surge absorbing element by at least one interlayer connection conductor that extends through the wiring layer with the spiral shape of the inductor conductor surrounding the at least one interlayer connection conductor;
wherein the inductor conductor is not physically connected to the at least one interlayer connection conductor;
wherein the first inductor conductor and the second inductor conductor are connected in series and are coplanar to each other extending in the plan view of the wiring layer;
wherein the first inductor conductor is disposed concentrically with the second inductor conductor; and
wherein respective portions of the first inductor conductor and the second inductor conductor extend parallel to each other.

2. The ESD protection element according to claim 1,
wherein the surge absorbing element includes first and second ends; and
wherein a first terminal conductor is connected to the first end of the surge absorbing element, and a second terminal conductor is connected to the second end of the surge absorbing element.

3. The ESD protection element according to claim 2, further comprising:
a first via connection conductor that connects the outer peripheral end of the inductor conductor to the first external connection terminal;
a second via connection conductor that connects the inner peripheral end of the inductor conductor to the second external connection terminal; and
a third via connection conductor that connects the connection conductor to the first terminal conductor.

4. The ESD protection element according to claim 1, wherein the surge absorbing element comprises at least one Zener diode.

5. The ESD protection element according to claim 1, wherein the connection conductor has a width larger than the width of the first inductor conductor in the plan view of the wiring layer.

6. The ESD protection element according to claim 1, wherein the spiral shape includes a corner portion, and the connection conductor is disposed at the corner portion.

7. The ESD protection element according to claim 1, wherein the spiral shape includes a bent or curved portion, and the connection conductor is disposed at the bent or curved portion.

8. The ESD protection element according to claim 1, further comprising a plurality of insulating layers disposed between the inductor conductor and the substrate.

9. The ESD protection element according to claim 1, wherein the respective portions of the first and second inductor conductors that extend parallel to each other each have a width in the plan view that is perpendicular to a direction of current flow in the respective inductor conductor, and the respective width of the second inductor conductor is smaller than the respective width of the first inductor conductor.

10. The ESD protection element according to claim 1,
wherein the wiring layer is disposed on the substrate and comprises a plurality of insulating layers,
wherein the inductor conductor is disposed on a first insulating layer of the plurality of insulating layers, and
wherein the first, second and third external connection terminals are disposed on a second insulating layer of the plurality of insulating layers, with no other conductors disposed on the second insulating layer.

11. The ESD protection element according to claim 1, further comprising:
a wiring conductor disposed in the wiring layer,
wherein the at least one connection conductor portion includes a first connection conductor portion that directly connects the wiring conductor to the third external connection terminal,
wherein the at least one connection conductor portion includes a second connection conductor portion that directly connects the wiring conductor to the surge absorbing element, and
wherein the wiring conductor extends in a direction coplanar with the inductor conductor, such that the second inductor conductor surrounds the wiring conductor and is not physically connected to the wiring conductor.

12. An ESD protection element comprising:
a substrate including a semiconductor region having a surge absorbing element;
a wiring layer disposed on the substrate;
first, second and third external connection terminals disposed in or on the wiring layer; and
an inductor conductor disposed in the wiring layer and having a spiral shape in a plan view of the wiring layer,
wherein the inductor conductor includes:
a first inductor conductor disposed on an outer peripheral side of the inductor conductor and directly connected to the first external connection terminal;
a second inductor conductor disposed on an inner peripheral side of the inductor conductor and connected to the second external connection terminal;
a connection conductor between the first and second inductor conductors and connected to the third external connection terminal via the surge absorbing element,
wherein the first inductor conductor and the second inductor conductor are connected in series and are coplanar to each other extending in the plan view of the wiring layer, wherein the first inductor conductor is disposed concentrically with the second inductor conductor, wherein respective portions of the first inductor conductor and the second inductor conductor extend parallel to each other, and wherein the third external connection terminal is connected to the surge absorbing element by at least one interlayer connection conductor that extends through the wiring layer with the spiral shape of the inductor conductor surrounding the at least one interlayer connection conductor, such that the inductor conductor is not physically connected to the at least one interlayer connection conductor.

13. The ESD protection element according to claim 12, wherein the surge absorbing element includes first and second ends; and wherein a first terminal conductor is connected to the first end of the surge absorbing element, and a second terminal conductor is connected to the second end of the surge absorbing element.

14. The ESD protection element according to claim 13, further comprising:

a first via connection conductor that connects an outer peripheral end of the inductor conductor to the first external connection terminal;

a second via connection conductor that connects an inner peripheral end of the inductor conductor to the second external connection terminal; and a third via connection conductor that connects the connection conductor to the first terminal conductor.

15. The ESD protection element according to claim 12, wherein the surge absorbing element comprises at least one Zener diode.

16. The ESD protection element according to claim 12, wherein the connection conductor has a width larger than the width of the first inductor conductor in a plan view of the wiring layer.

17. The ESD protection element according to claim 12, wherein the spiral shape of the inductor conductor includes a corner portion, and the connection conductor is disposed at the corner portion.

18. The ESD protection element according to claim 12, wherein the spiral shape of the inductor conductor includes a bent or curved portion, and the connection conductor is disposed at the bent or curved portion.

19. The ESD protection element according to claim 12, further comprising a plurality of insulating layers disposed between the inductor conductor and the substrate.

20. An ESD protection element comprising:

a substrate including a semiconductor region having a surge absorbing element;

a wiring layer disposed on the substrate; and an inductor conductor disposed in the wiring layer and having a spiral shape including an outer peripheral end and an inner peripheral end, the inductor conductor including:

a first inductor conductor disposed on an outer peripheral side that includes the outer peripheral end;

a second inductor conductor disposed on an inner peripheral side that includes the inner peripheral end; and a connection conductor that connects the first inductor conductor to the second inductor conductor;

wherein the first inductor conductor is coplanar and disposed concentrically with the second inductor conductor, wherein respective portions of the first inductor conductor and the second inductor conductor extend parallel to each other, and wherein an external connection terminal is connected to the surge absorbing element by at least one interlayer connection conductor that extends through the wiring layer with the spiral shape of the inductor conductor surrounding the at least one interlayer connection conductor, such that inductor conductor is not physically connected to the at least one interlayer connection conductor.

21. The ESD protection element according to claim 20, further comprising:

first, second and third external connection terminals disposed in or on the wiring layer, with the third external connection terminal being the external connection terminal connected to the wiring conductor, wherein the outer peripheral end of the inductor conductor is directly connected to the first external connection terminal, wherein the inner peripheral end of the inductor conductor is connected to the second external connection terminal.

22. The ESD protection element according to claim 21, wherein the surge absorbing element includes first and second ends; and wherein a first terminal conductor is connected to the first end of the surge absorbing element, and a second terminal conductor is connected to the second end of the surge absorbing element.

23. The ESD protection element according to claim 22, further comprising:

a first via connection conductor that connects an outer peripheral end of the inductor conductor to the first external connection terminal;

a second via connection conductor that connects an inner peripheral end of the inductor conductor to the second external connection terminal; and a third via connection conductor that connects the connection conductor to the first terminal conductor.

* * * * *